(12) United States Patent
Stettner et al.

(10) Patent No.: US 6,690,019 B2
(45) Date of Patent: Feb. 10, 2004

(54) HIGH DATA RATE SMART SENSOR

(75) Inventors: Roger Stettner, Santa Barbara, CA (US); Howard W. Bailey, Santa Barbara, CA (US)

(73) Assignee: Advanced Scientific Concepts, Inc., Santa Barbara, CA (US)

( * ) Notice: Subject to any disclaimer, the term of this patent is extended or adjusted under 35 U.S.C. 154(b) by 0 days.

(21) Appl. No.: 10/090,017

(22) Filed: Feb. 22, 2002

(65) Prior Publication Data

US 2003/0029989 A1 Feb. 13, 2003

Related U.S. Application Data

(62) Division of application No. 09/154,617, filed on Sep. 16, 1998, now Pat. No. 6,362,482.
(60) Provisional application No. 60/059,097, filed on Sep. 16, 1997.

(51) Int. Cl.⁷ .................................................. G01T 1/24
(52) U.S. Cl. .............................. 250/370.08; 250/370.09
(58) Field of Search ........................ 250/370.08, 370.09, 250/370.11, 370.01, 370.06; 378/62, 98.8

(56) References Cited

U.S. PATENT DOCUMENTS 5,548,122 A * 8/1996 Shoji ..................... 250/370.09
5,696,577 A * 12/1997 Stettner et al. ............. 356/4.01

* cited by examiner

*Primary Examiner*—Scott J. Sugarman
*Assistant Examiner*—Richard Hanig
(74) *Attorney, Agent, or Firm*—Gottlieb, Rackman & Reisman, P.C.

(57) ABSTRACT

A device for the high-speed analysis of photon- or particle-generated image data or for the high-speed energy-discrimination analysis of photon- or particle-counting data. A sensor collects the photons or particles on an array of solid state detectors, as electrical analog signals, and stores the analog-signal information on capacitors of readout arrays associated with the detector arrays. Image-related signals are transferred to integrated circuit chips containing an array of correction processor unit cells. Corrected signals are transferred to an analog image processor. Particle-counting data is transferred directly from the readout array chips to the analog image processor having circuitry for implementing an image processing or energy discrimination algorithm.

4 Claims, 10 Drawing Sheets

HIGH DATA RATE SMART SENSOR

This application is a Division of Ser. No. 09/154,617 filed Sep. 16, 1995, U.S. Pat. No. 6,362,482 and claims benefit of Ser. No. 60/059,097 filed Sep. 16, 1997.

BACKGROUND OF THE INVENTION

Current large detector-array technologies, for particle or photon imaging or for counting, are frame rate or count rate limited. Examples of these detector array technologies are focal plane arrays used for visible and infrared light imaging and detector arrays used for x-ray florescent spectroscopy. The imaging speed limitation is usually related to the need to digitize all the data in the array and transfer it to a digital computer for processing. Digitizing and transferring all the data produces a data rate bottleneck and digitally processing all the data produces a processing rate bottleneck. High frame rates or count rates can currently be handled by massively-parallel digital processors. However, because of the shortcomings of these systems, namely high cost, large size and large-power consumption, this solution is not in common use.

This invention relates to cameras or sensors using detector arrays and analog-processing integrated-circuit architectures; the analog-processing circuitry allows a very compact and low power solution to the high-frame-rate and counting-rate problem. Data from the detector arrays is output, in analog form, directly to analog processing array chips where a processing algorithm or algorithms are implemented in unit cell circuitry. At the highest speeds, there is one or more processing unit cells for each detector and each analog-processing chip is composed of an array of unit cells. Processing occurs simultaneously, that is in parallel, in all unit cells. The analog processing chips provide for offset and gain correction; in the conventional imager design this correction is made in the digital computer. The analog-processing unit-cell-array chips and detector array are designed as a single camera or sensor system. Only data that satisfies the algorithms is output from the sensor greatly reducing the data rate. Special circuitry is used to select only the data that has satisfied the algorithm. The camera or sensor is called a smart camera or sensor because it processes data and selects the data to be output. Because most or all of the data processing occurs in the unit-cell arrays and because of the reduced data rate, the sensor output data can be further processed, if necessary, by a conventional digital computer without data-processing or data-rate bottlenecks. Since the camera or sensor is only composed of a few chips it is very compact and consumes little power.

There is currently a very complex analog processing architecture, using mammalian retina circuit analogs that propose to solve the high-data-rate, image-processing problem. The architecture, incorporating z-plane technology, uses thinned chips, usually silicon (one chip for each column), butted up on edge against the backside of the detector array chip. One edge of each z-plane chip is connected to each detector in a single column in the detector array. The detector array then sits on top of a cube of semiconductor chips. The processing algorithm is that of Carver Mead's biological-analogy Silicon Retina[1,2]. The shortcomings of z-plane technology are: (1) it requires a large volume of silicon and hence is expensive (512 chips for a 512×512 detector array for example); (2) the z-plane chips must thinned by a special process and all interconnected; this is expensive and difficult to accomplish without error; (3) image resolution is limited by the thickness of the z-plane chips; (4) difficulties dissipating heat in the z-plane three-dimensional cube limits processing speed; and (5) the number of outputs are very large, equal or greater than the number of detectors. Limitations of the biological-analogy algorithm are: (1) spatial averaging reduces resolution to larger than the pixel size; (2) difficulties with implementing gain and offset corrections leads to spurious images and noise; and (3) the silicon-retina edge algorithm is of limited application.

[1] Carver Mead, Analog VLSI and Neural Systems, Addison Wesley 1989.
[2] M. A. Mahowald and C. Mead, The Silicon Retina, Scientific American, May 1991, pg 76.

The current invention overcomes all the difficulties of the z-plane technology because it requires very few chips and uses conventional CMOS without special processing. There are no limitations in detector size; the two dimensional architecture easily dissipates heat. There are few outputs and resolution is defined by the pixel geometry. Gain and offset corrections are straight forward and the algorithms that can be implemented are quite general.

Another application of the present invention is a High-Count-Rate Energy-Discriminating x-ray photon or high energy particle Detector (HRED) which can process three to four orders-of-magnitude higher count rate than current energy-dispersive spectrometers. High-count-rate x-ray detectors are important in many areas of science where there is a large background and high signal to noise ratio is obtained by energy discriminating the signal from the background. Examples are the non-invasive high-speed quantitative measure of lead in bones and other elements in other organs[3,4,5]. Data collection is particularly limited in structural biology investigations of dilute samples where detectors have not kept pace with synchrotron source development. The Extended X-ray Absorption Fine Structure (EXAFS) technique, counting fluorescent x-rays, has been known for some time[6], for example, but the counters have very limited data rates which cannot adequately take advantage of current and future synchrotron source fluxes. Many samples have low concentrations of the element of interest that is embedded in a matrix of energy absorbing molecules. Under these conditions conventional detectors expend their count rate separating the desired-element-fluorescence x-rays from the larger number of quasi-elastic and matrix-fluorescence x-rays.

3. L. Preiss and M. A. Tariq On the use of L x-ray fluorescence for bone lead evaluation, Radiocanal. Nucl. Chem. Let. 164 (6), 381–385 (1992).
4. I. L. Preiss and T. PTAK, Trace Element Profiles of Biological Samples Using Radioscope X-ray Fluorescence, Nuclear Instruments and Methods in Physics Research A242 (1986) 539–543.
5 A. S. Frank et al, Trace Element Profiles in Murine Lewis Lung Carcinoma by Radioscope-Induced X-Ray Fluorescence, AJP, March 1986, Vol. 122, No. 3.

A widely used x-ray fluorescence-detected spectroscopy detector is the 13-element Canberra Ge Detector[7]. Reference 7 shows the count rate of a single element, using a 1 $\mu s$ shaping time corrected for dead time losses, is about $2 \times 10^5$ photons/sec (dead time of about 5 $\mu s$). This count rate is inadequate for many synchrotron-based experiments and is a source of frustration for researchers who are preparing to use the newest beam lines. Furthermore the shaping time for optimum energy resolution[8] is about 14 $\mu s$ and leads to about an order of magnitude reduction in counting rate at the optimum energy resolution. A single module of the current invention is roughly the same area as a single element of the 13-element detector and has a count rate of $2.5 \times 10^8$ sec$^{-1}$ at the highest energy resolution. This count rate is three to four orders of magnitude higher than a single element of the 13-element detector.

[6] I. J. Jaklevic et al, Solid State Communications, 23, 679 (1977).
[7] S P. Cramer et al, A 13-Element Ge Detector For Fluorescence EXAFS, Nuclear Instruments and Methods in Physics Research, A266, 586 (1988).
[8] Quantitative X-ray Spectrometry, Ron Jenkins et. al., Marcel Dekker, Inc., 1981.

BRIEF DESCRIPTION OF THE PRESENT INVENTION

The present invention comprises a sensor for detection of photons or particles. Detection takes the form of a two-dimensional unit-cell array of electrical signals. The sensor includes an analog image processor for implementing an image-processing or energy-discrimination algorithm and for outputting only the signals and/or the positions of the unit cells for which the algorithm was satisfied; an alternative output is the number of unit cells which satisfy the algorithm. One embodiment of the invention also comprises an analog correction processor, located between the sensor and image processor, that corrects the signals for nonuniformities of the invention. The invention further comprises drive electronics to provide the timing pulses and biases necessary for operation of the sensor, output electronics for conversion of the analog to digital signals and storage of the digital signals, and digital data processors to further analyze the digital signals.

It is the object of the present invention to provide high-speed devices for the collection and analysis of photon or particle, image or counting data which overcomes problems of prior systems associated with data bottlenecks, slow image processing and slow counting.

It is further the object of the present invention to provide a device for making high-speed analog gain and offset corrections to analog data.

It is still further the object of the present invention to provide a device for high-speed implementation of data processing algorithms on analog data and for outputting only the important data.

DETAILED DESCRIPTION OF A PREFERRED EMBODIMENT OF THE INVENTION

Figure 1:
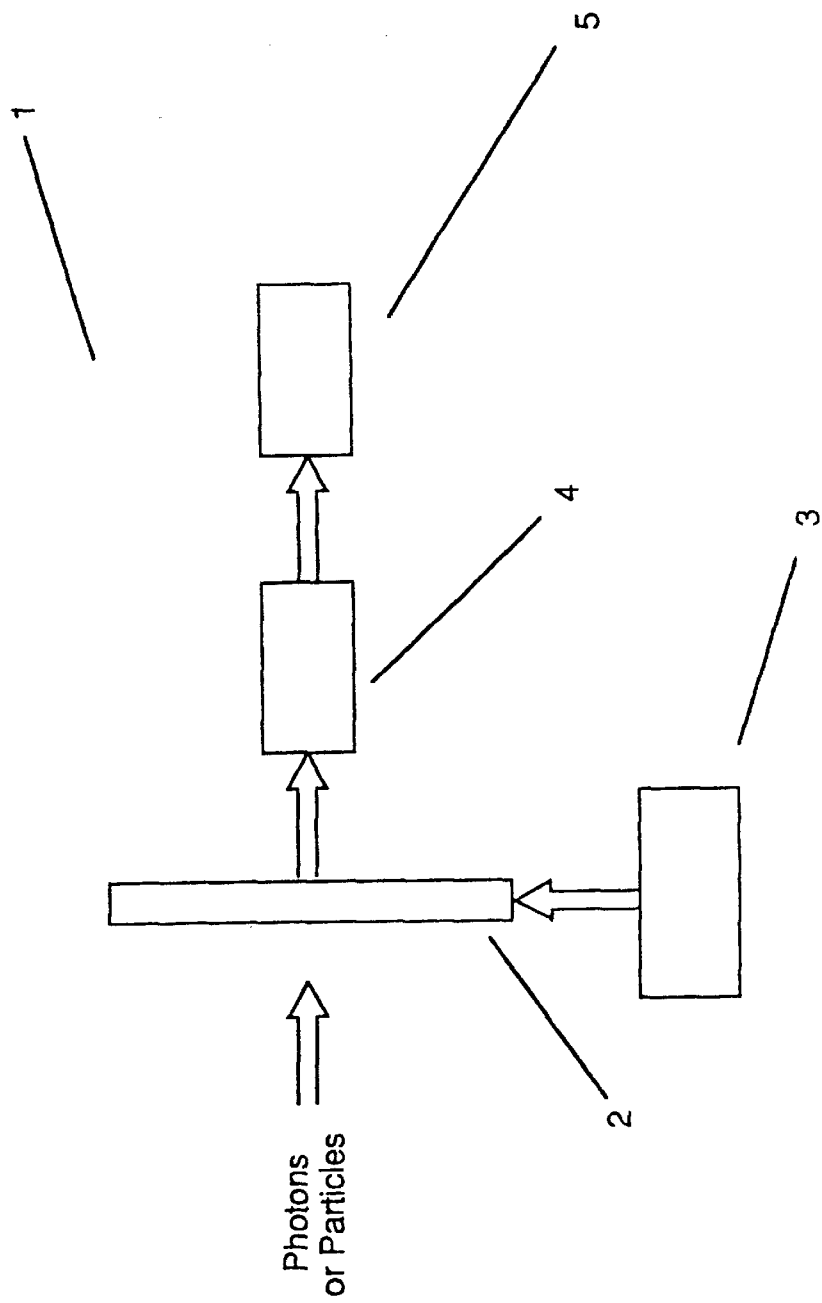
FIG. 1 is a schematic representation of the major components of a high data rate smart sensor.

A preferred embodiment of the present invention, the High Data Rate Smart Sensor System (HDSS) 1 depicted in FIG. 1 block diagram, is designed to processes data generated by an array of detectors located in a sensor 2. This system 1 is further comprised of sensor drive electronics 3. The HDSS may further be comprised of digitizing and output electronics 4, a digital data processor and display 5.

Figure 2:
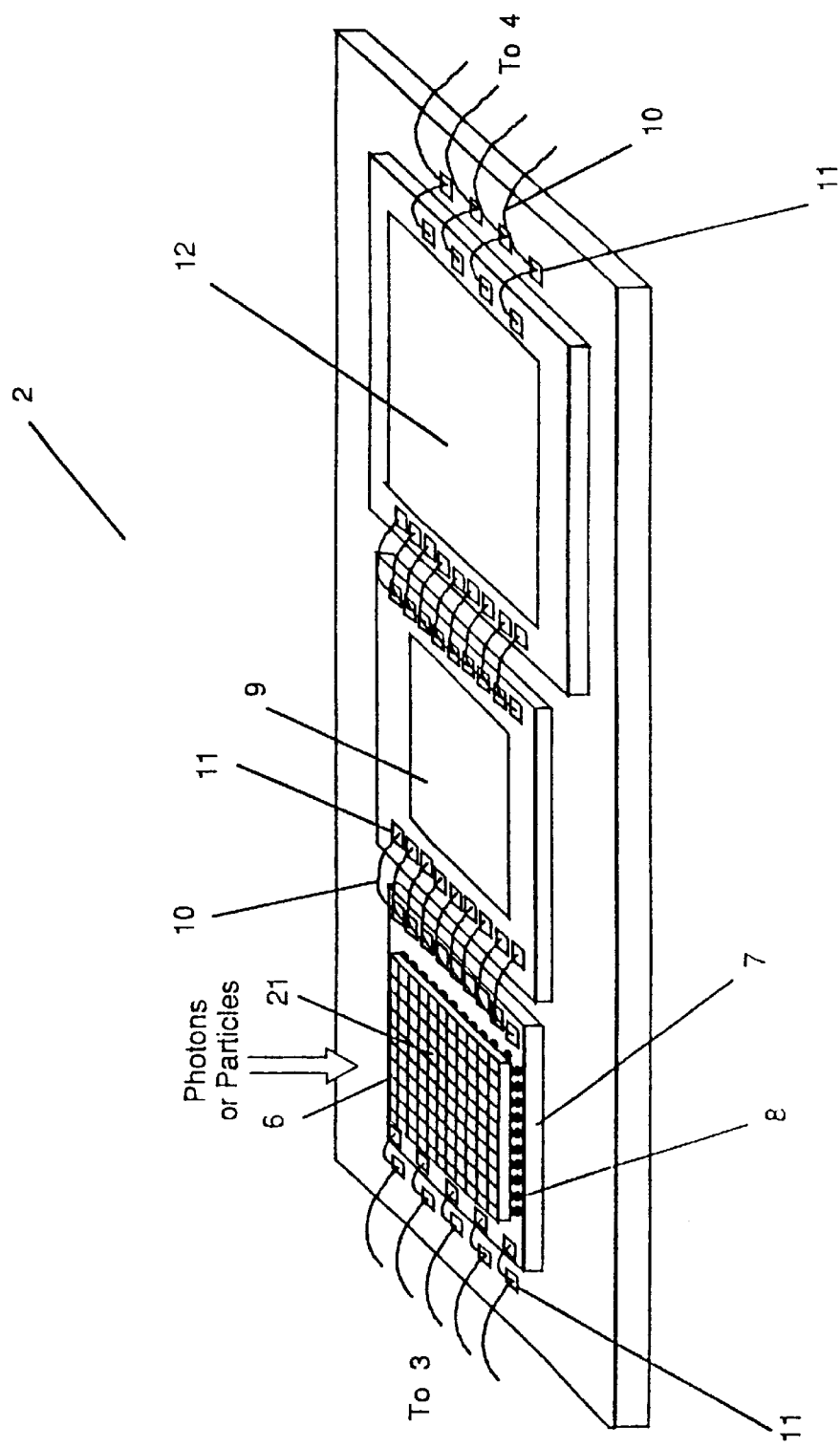
FIG. 2 is one embodiment of the sensor of the present invention.

One embodiment of the sensor 2 is shown in FIG. 2. It is comprised of a detector array chip 6 connected to a readout array chip Z by bump bonds 8; the readout array chip 7 is connected to an analog correction processor 9 by wire bonds 10 and bond pads 11. Typically the detector array is a PIN diode array made from solid-state materials such as silicon or germanium. The readout array chip may be, alternatively, connected to the analog correction processor by a interconnect chip which is bump bonded to both chips; bump bonds taking the place of wire bonds. The analog correction processor 9 may be one or more chips. The analog correction processor 9 is connected to an analog image processor 12 by wire bonds 10 and bond pads 11. Alternatively the wires may be replaced by an interconnect chip and the wire bonds replaced by bump bonds. Alternatively all processors could be made on a single chip with no interconnections necessary. The analog data processor 12 may be one or more chips. Wire bonds and wire bond pads also connect the sensor 2 to the drive electronics 3 and the output electronics 4. The analog correction processor 9 and the analog image processor 12 may be screened from the photons or particles (screen not shown), particularly if the photons are x-rays, gamma-rays or the particles are higher-energy particles. The photons might be visible, infrared, ultraviolet, x-ray or gamma-ray photons. Where heat dissipation is not a problem the chips making up the sensor 2 may be stacked one on top of another to make a compact regular prism. Electrical connections are then made by via the wire bond pads but by cutting into the chips at the wire bond pad and inserting a continuous metal conductor in the cut.

In another embodiment of the sensor 2 in FIG. 2, the readout array chip may be directly connected to the analog image processor 12 and the analog correction processor 9 eliminated. In still another embodiment of the sensor the detector array chip 6 and readout array chip Z may be replaced by a charged coupled device (CCD) or a monolithic readout array and detector array design where the detector is incorporated in the readout unit cell.

If only the analog correction processor 9 and the analog image processor 12 are present in FIG. 2, the system is called an analog data processor. The analog data processor could also be comprised of only the analog image processor 12.

Figure 3:
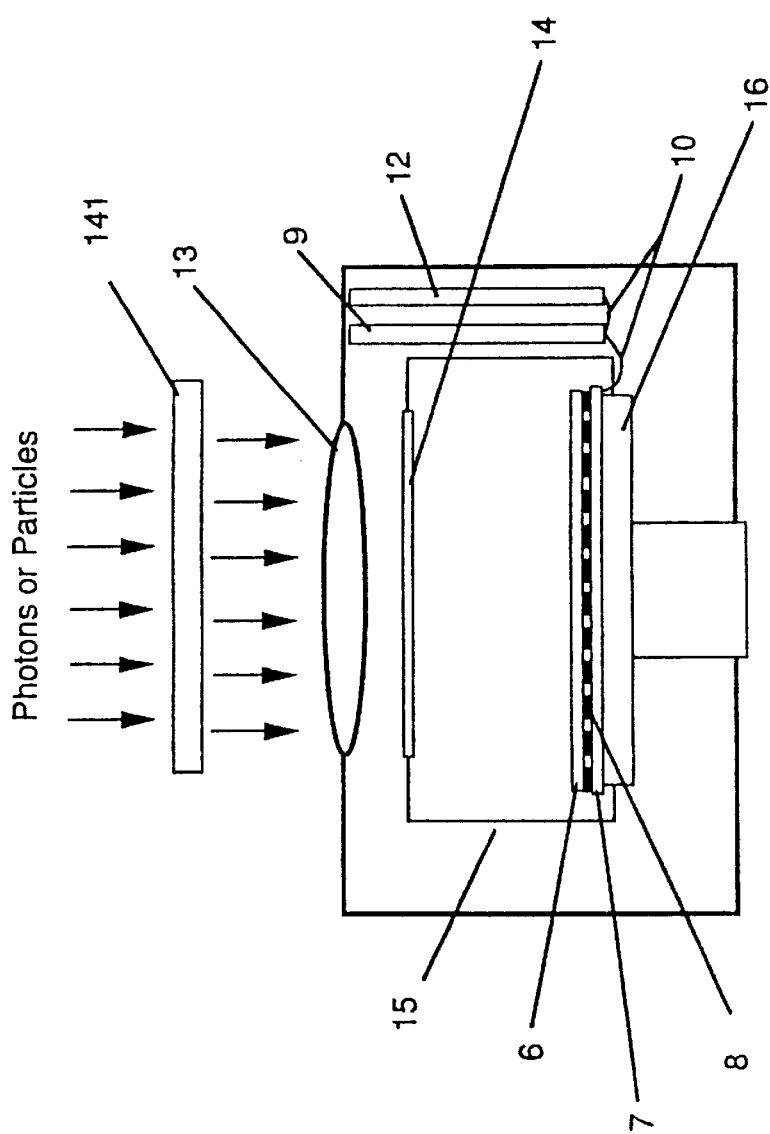
FIG. 3 is a side view of an embodiment of the sensor of the present invention used for imaging photons.

FIG. 3 shows an embodiment of the sensor 2 of the HDSS system 1 used for photons that can be diffracted by lenses to form an image on the detector array chip 6 or CCD. These photons include those of ultraviolet, visible and infrared light. The sensor 2 is comprised, as in FIG. 2, of a detector array chip 6, connected with bump bonds 8 to a readout array chip 7. The detector-array chip and readout-array chip could be replaced by a CCD. The sensor 2 in FIG. 3 is further comprised of an analog correction processor 9, an analog image processor 12, a lens 13, a window 14, a cold shield 15, and a cold finger 16. Wire bonds 10 interconnect the chips. Typical dimensions for the sensor 2 in FIG. 3 are a few inches on all three sides. The window, cold shield and cold finger are usually only necessary for infrared photons. Where the sensor 2 is used to energy discriminate and count x-ray photons or charged particles, rather than image the photons or charged particles, typically the cold finger 16 and cold shield 15 are necessary, but the lens 13 and the analog correction processor 9 may not be present, and the window 14 would be a thin, low atomic number material such as beryllium. The lens 13 and window 14 in FIG. 3 could be replaced by a converter 141 or the converter could be placed above the lens position. High-energy photons or particles would first pass through the converter 141 before the lens and these photons or particles would be converted to lower energy photons or electrons before interacting with the detector array 6.

Figure 4:
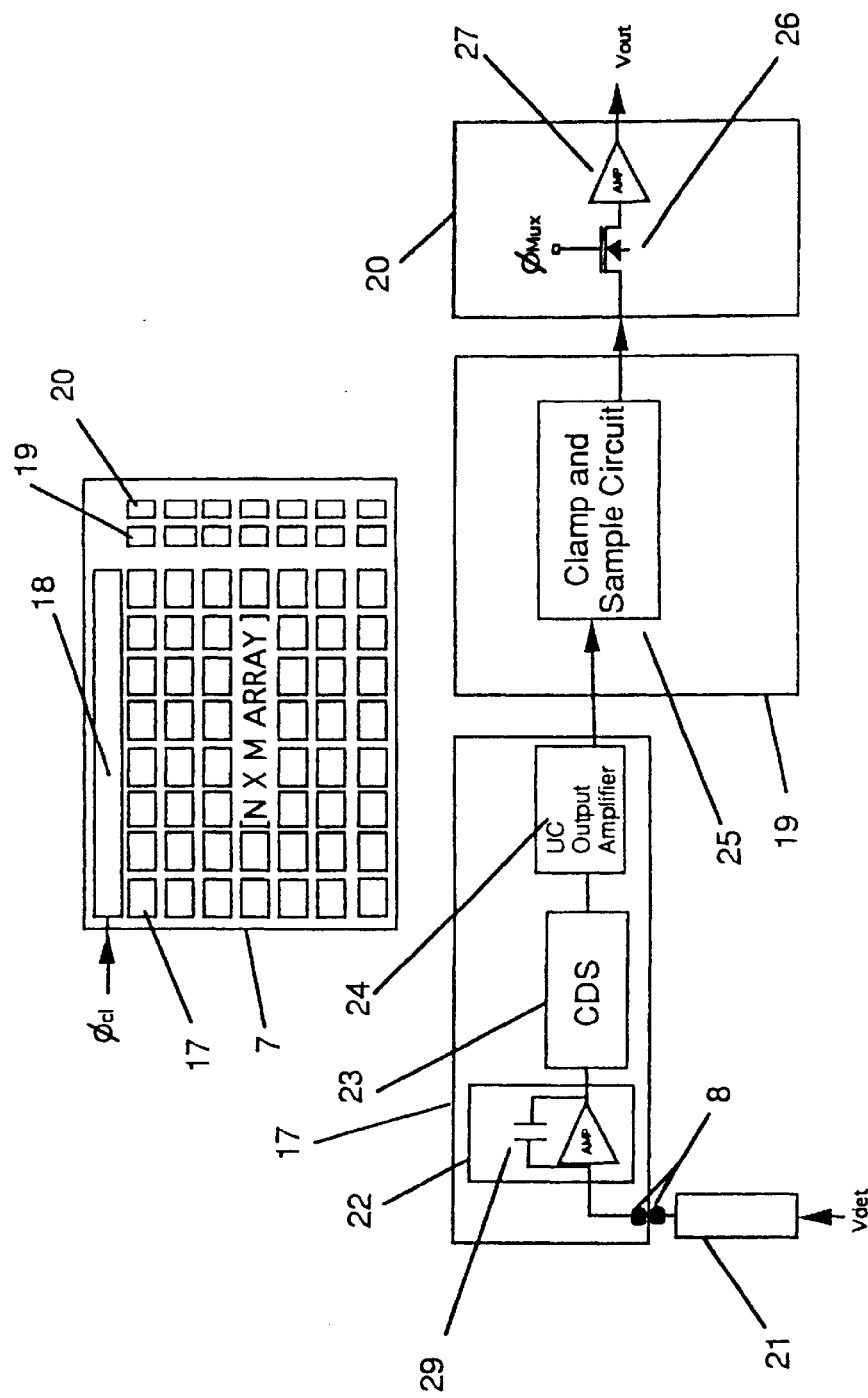
FIG. 4 is a schematic diagram of a particle counting or low-flux integration embodiment of the readout array chip of the present invention.

FIG. 4 shows the embodiment of the readout array chip 7 of the present invention preferred for x-ray and particle energy-discrimination and counting, or just counting. The FIG. 4 embodiment could also be used for integrating low-flux, continuous, photon or particle signals. The readout array chip 7 contains an array of readout unit cells 17, column selector circuits 18, row clamp and sample circuits 19, and row output circuits 20. The column selector circuits 18, row clamp and sample circuits 19 and row output circuits 20 can be collectively referred to as peripheral circuitry.

In general there is one clamp and sample circuit 19 and one output circuit 20 associated with each row. However, there may be more or less depending upon the speed requirements of the system. The row output circuits 20 may include a row output multiplexer 26 and output amplifier 27. The clamp and sample circuit 25 may contain clamp and sample memory. The readout unit cell 17 is connected to an individual detector 21 in the detector array via bump bonds 8 and contains a capacitive transimpedance amplifier circuit 22, a correlated double sampler circuit 23 and a unit cell output amplifier 24.

Figure 5:
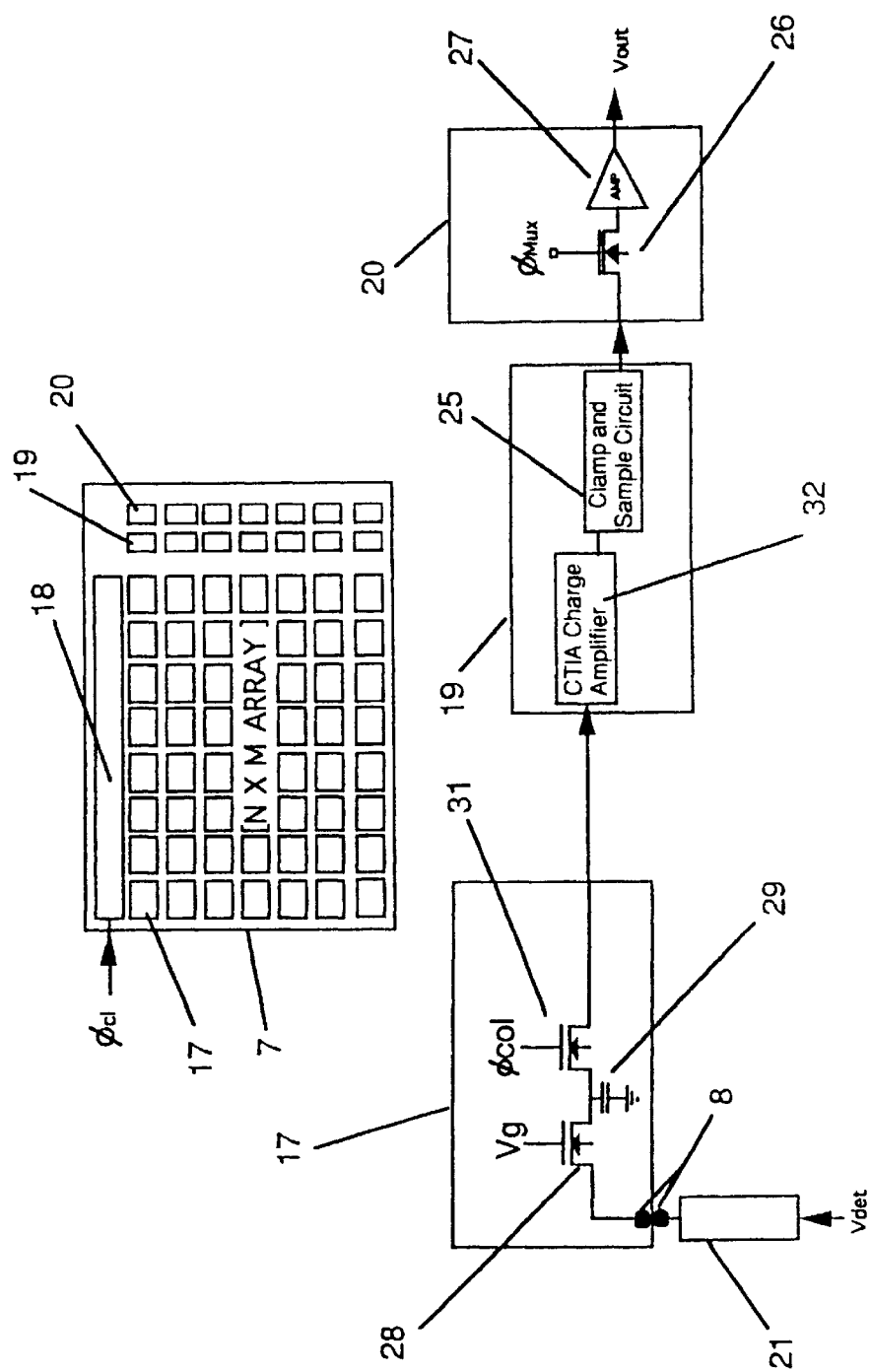
FIG. 5 is a schematic diagram of a high flux integration embodiment of the readout array chip of the present invention.

FIG. 5 is a second embodiment of the readout chip Z preferred for integrating higher-intensity continuous photon or particle fluxes. In this case the readout unit cell 17 contains direct injection circuitry. An individual detector 21 is electrically and mechanically connected to the readout unit cell by means of a bump bond 8. The electrical connection is made to an integration capacitor via a coupling transistor 28. The integration capacitor 29 is connected to the row clamp and sample circuits 19 via a column switch 31. The row clamp and sample circuits 19 contain both a CTIA charge amplifier 32 and a clamp and sample circuit 25.

Figure 6:
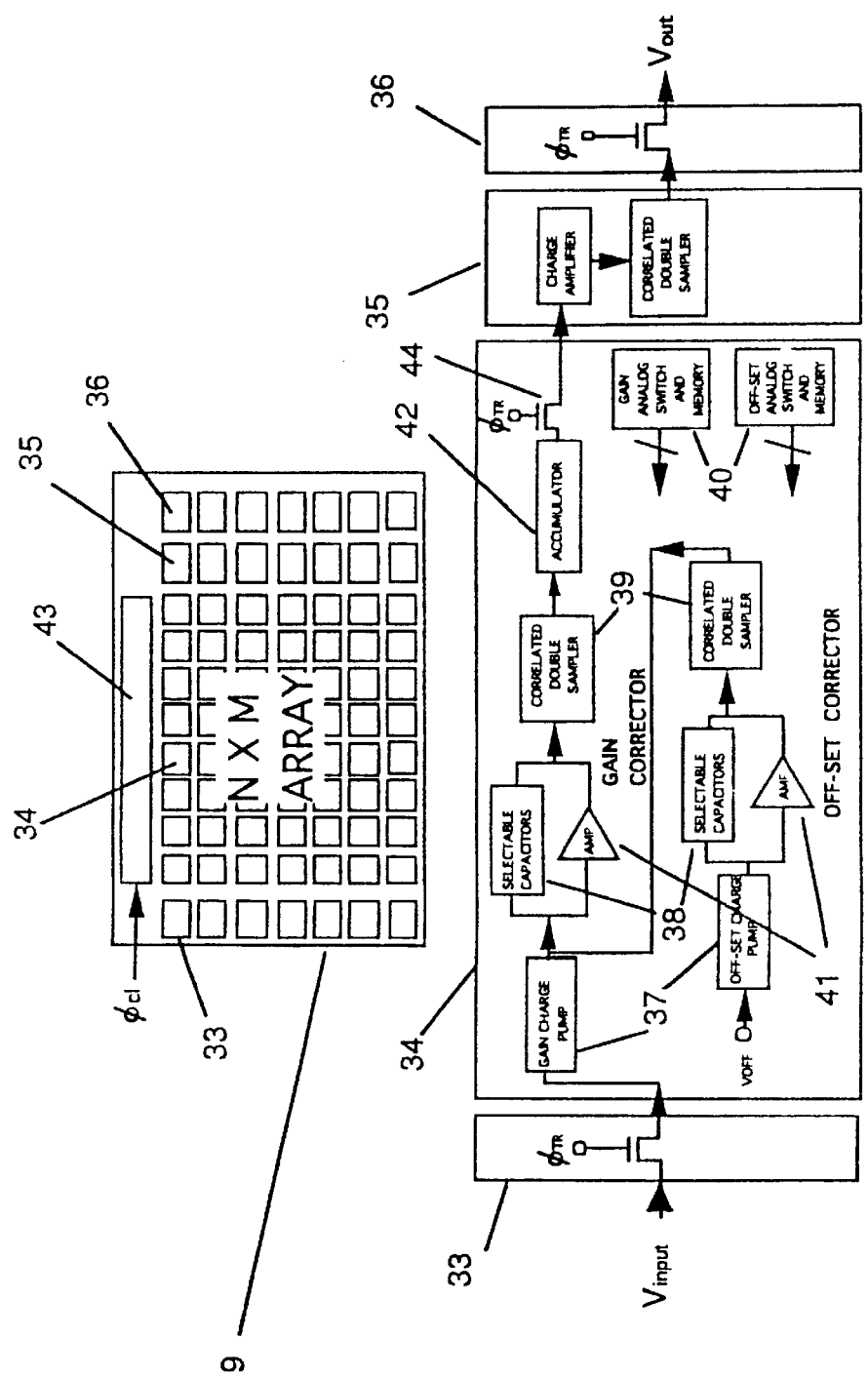
FIG. 6 is a schematic diagram of the analog correction processor of the present invention.

FIG. 6 is an embodiment of the analog correction processor chip 9 of the present invention preferred for integrating continuous photon or particle signals. The corrector chip 9 contains a column of row input multiplexers 33, an array of corrector unit cells 34, a column of row output amplifier unit cells 35, a column of row output multiplexers 36 and column selector circuits 43. Collectively the input multiplexers, the column selector circuits 43, the amplifier unit cells 35 and the output multiplexers 36 can be referred to as peripheral circuitry. In its highest speed configuration the gain corrector chip 9 has one corrector unit cell 34 for each readout unit cell 17. For lower speed configurations the number of columns can be reduced with data multiplexed into the gain corrector chip 9 from the readout chip Z. The corrector unit cell contains duplicate circuitry for both gain and offset correction. This circuitry includes Charge Pumps 37, capacitive transimpedance amplifiers 41 with selectable capacitors 38 and correlated double samplers 39. The off-set correction can be input to the gain corrector just after the gain charge pump 37 or elsewhere. The output of the gain-corrector correlated double sampler may be input to an accumulator 42 that integrates a number of frames. The accumulator 42 may or may not be present depending upon the signal to noise ratio. The corrected signal is output from the accumulator 42 through a multiplexing switch 44 to its row output amplifier unit cell 35 and then to the row output multiplexer 36. Information as to which selectable capacitors 38 to choose is stored in the analog switch and memory circuitry 40; although not explicitly shown in FIG. 6, the selectable capacitors 38 are electrically connected to the analog switch and memory circuitry 40.

Figure 7:
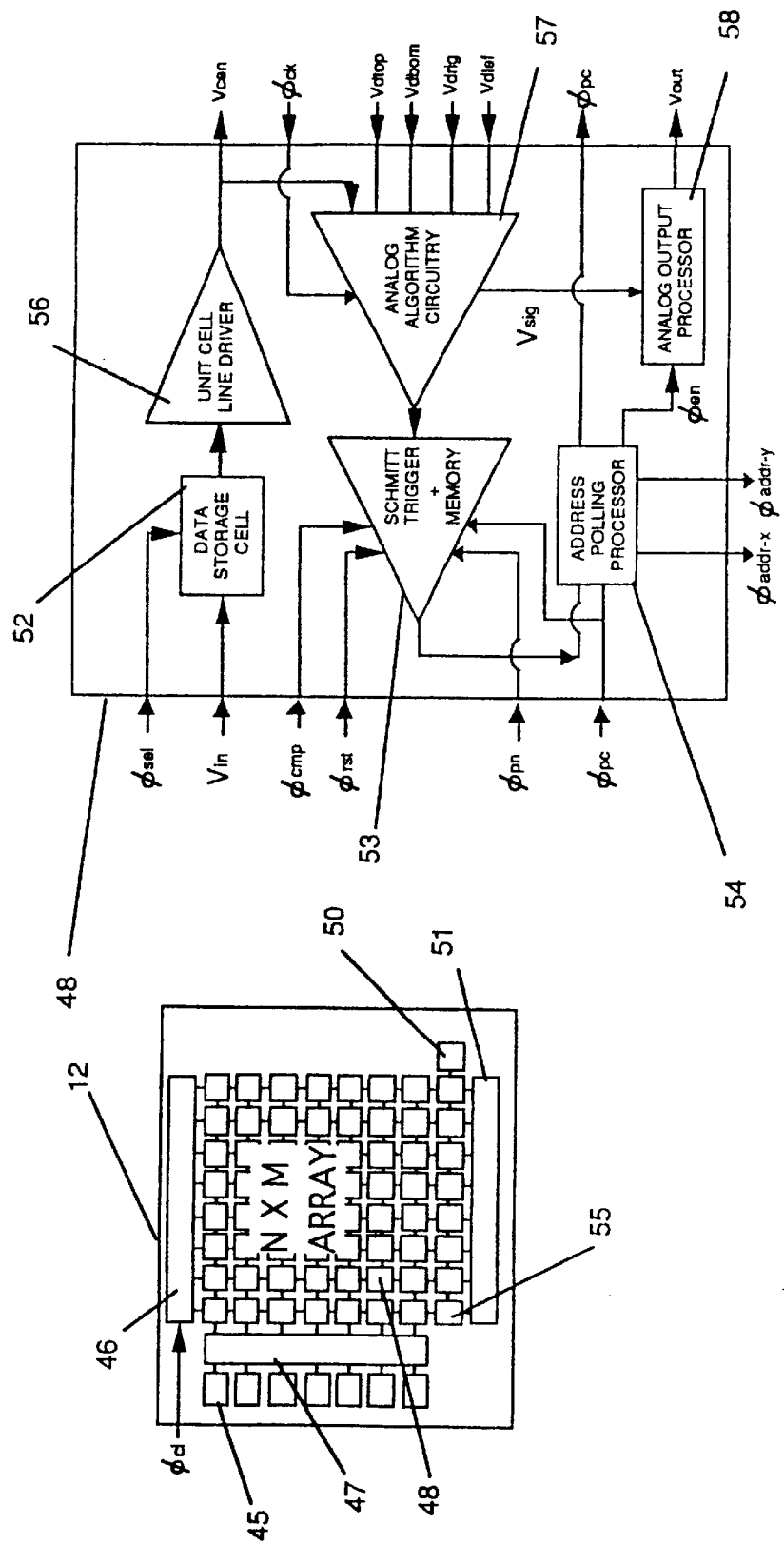
FIG. 7 is a schematic diagram of an image processing embodiment of the analog image processor of the present invention.

FIG. 7 shows in greater detail the analog image processor 12 of the present invention preferred for processing of image data. The analog image processor 12 is comprised of a row of input multiplexer unit cells 45, row encoder circuitry 47, column encoder circuitry 51, column selector circuitry 46 and an array of analog processor unit cells 48. The input multiplexer unit cells 45, row encoder circuitry 47, column encoder circuitry 51 and column selector circuitry 46 can be collectively referred to as peripheral circuitry. For the highest speed processing there is one analog image processor unit cell 48 for each detector in the detector array chip 6. Fewer columns are required in the analog image processor 12 for lower speed processing. Each column of analog processor unit cells is associated with a column selector switch 55 that connects each column to an output driver. There are also column loads that are not explicitly shown.

FIG. 7 also shows a block circuit diagram of the analog image processor unit cell 48. A data storage unit cell 52 is connected to a unit cell line driver 56 that is electrically connected to all contiguous unit cells in the analog data processor 12. The line marked Vcen takes the signal voltage to the unit cells above, below, to the right and to the left of it. The unit cell line driver 56 is also connected to the analog algorithm circuitry 57. The analog algorithm circuitry 57 is electrically connected to the contiguous unit cells in the analog data processor 12. This connection is depicted in FIG. 7 by the lines marked Vdtop, Vdbom, Vdrig and Vdlef that represent signal voltages from the unit cells above, below, to the right and to the left respectively. Signals from more or fewer of the contiguous unit cells could be input to a single unit cell depending upon the algorithm. The analog algorithm circuitry 57 is electrically connected to the schmitt trigger and memory 53 that is electrically connected to the address polling processor 54. The address polling processor 54 is electrically connected to the analog output processor 58. In this application both the address polling processor 54 and the analog output processor 58 output signals to the output electronics 4, FIG. 1. The address polling processor outputs the addresses of the specific pixels isolated by the analog algorithm circuitry and the analog output processor outputs the signals on those specific pixels. For edge detection the analog algorithm circuitry is a dynamic comparator and amplifier.

Figure 8:
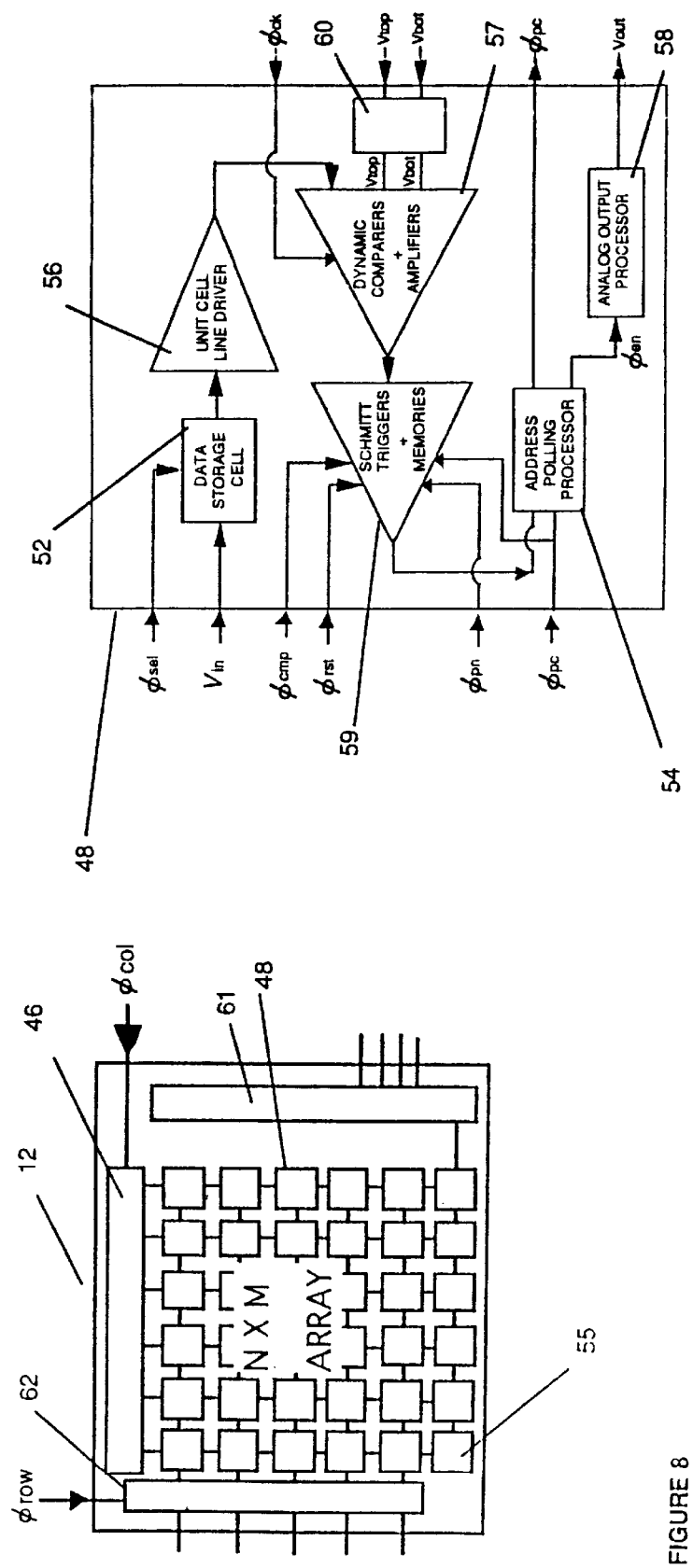
FIG. 8 is a schematic diagram of a particle counting embodiment of the analog image processor of the present invention.

FIG. 8 shows in greater detail the analog image processor 12 of the present invention preferred for particle or photon energy discrimination. For this application the analog correction processor 9 is absent from the sensor 2 in FIG. 2 and the readout array chip 7 is electrically connected, row by row, directly to the analog data processor 12 via the wire bond pads 11. Connections to the wire bond pads can be made using wires, interconnect chips and metal bumps, or stacking the chips and cutting them at the bond pads and inserting conductors. The analog data processor 12 is comprised of row selector circuitry 62, column selector circuitry 46 and an array of analog processor unit cells 48. For the highest speed processing there is one analog processor unit cell 48 for each detector in the detector array chip 6. Fewer columns are required in the analog data processor 12 for lower speed processing. Each column of analog processor unit cells is associated with a column selector switch 55 that connects each column to a counter 61. There are also column loads that are not explicitly shown. The row selector circuitry 62, column selector circuitry 46, and column selector switches 55 can be referred to as peripheral circuitry.

FIG. 8 also shows a block circuit diagram of the analog processor unit cell 48 preferred for particle or photon energy discrimination. A data storage unit cell 52 is connected to a unit cell line driver 56 that is electrically connected to a dynamic comparator and amplifier 57. The dynamic comparator and amplifier is particular analog algorithm circuitry. The dynamic comparator and amplifier is connected to memory 60 which holds the energy discrimination interval bounds, Vtop and Vbot. These bounds are input from the drive electronics 3. The dynamic comparator and amplifier 57 is also electrically connected to the Schmitt triggers and memories 57 which is electrically connected to the address polling processor 54. The address polling processor 54 is electrically connected to the analog output processor 58. The analog output processor 58 is electrically connected to the counter and poll-next timing generator 61. The counter and poll-next timing generator 61 is connected both to the polling processors 54 in all unit cells and to the output electronics 4. The number of counts in a particular energy bin is output to the output electronics 4.

Figure 9:
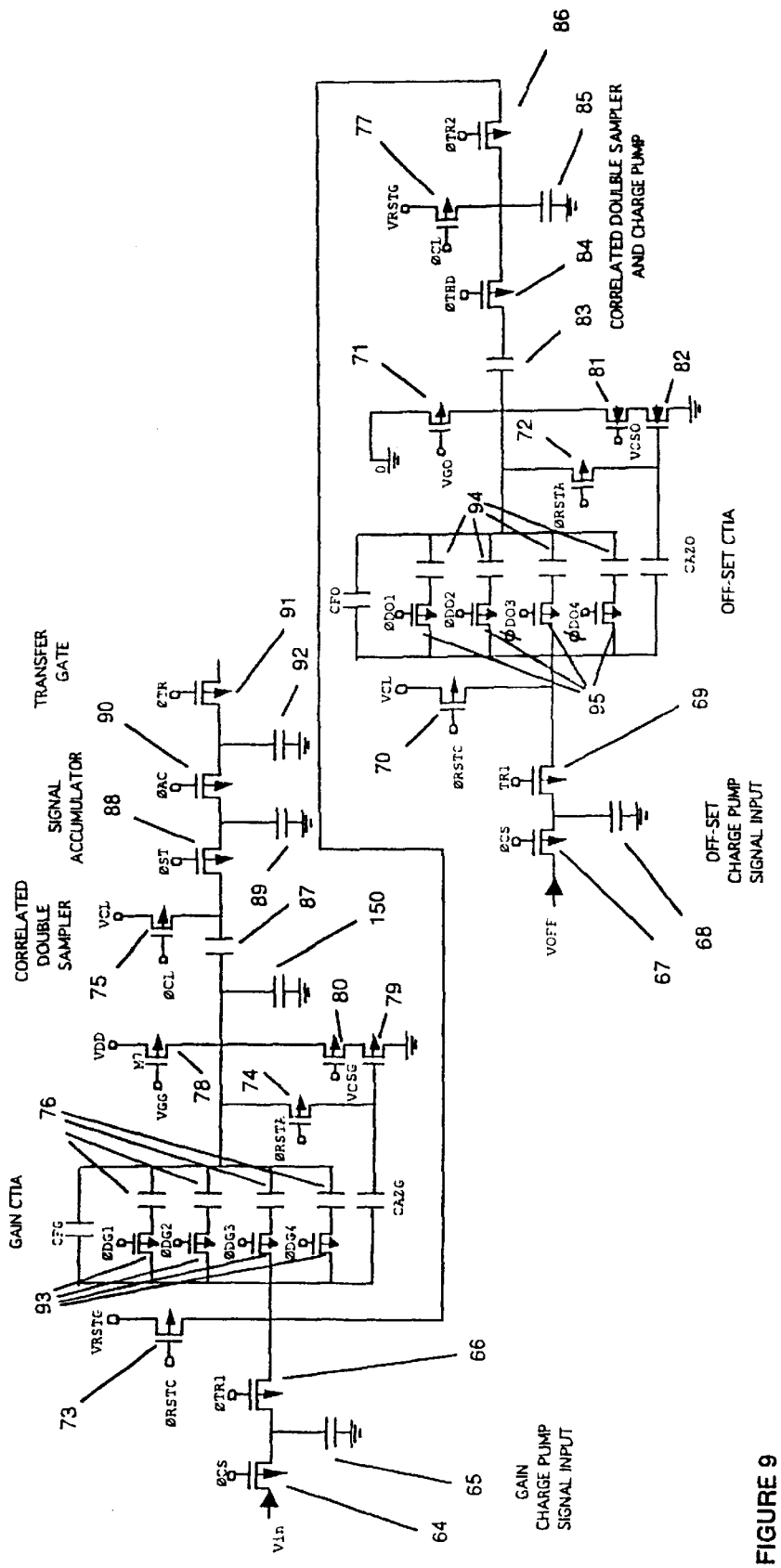
FIG. 9 is a schematic of the gain and offset, analog correction processor, unit cell circuitry.

FIG. 9 shows in greater detail the preferred gain corrector and offset corrector circuitry of the correction processor unit cell 34. The signal voltage from the associated readout unit cell 17 in the readout chip 7 enters the gain charge pump through the MOSFET switch 64 and is stored as a charge packet on capacitor 65. The charge packet enters the gain charge amplifier through MOSFET switch 66. The offset correction also enters the gain charge amplifier at this node although it could enter elsewhere. The offset voltage, which is specific to the processing chain starting with a particular detector 21, on the detector array 6 is input to the offset charge pump through MOSFET switch 67 and stored on capacitor 68. The charge packet enters the offset charge amplifier through MOSFET switch 69. The offset amplifier is a capacitive transimpedance amplifier (CTIA) where the amplification is governed by the selectable capacitors 94 through the MOSFET selector switches 95. The transistors comprising the amplifier are 81, 82, and 71, where the two MOSFETS 82 and 81, fabricated as a dual gate transistors, are the driver and MOSFET 71 is the load. The offset corrected charge packet is stored on capacitor 85 and clocked into the gain charge amplifier by MOSFET 86. The signal charge packet and offset correction charge packet enter the gain charge amplifier together in this design. The gain charge amplifier, like the off-set charge amplifier, is a CTIA where the selectable capacitors 76 are chosen through the selector switches 93 and are unique to a processing chain starting with a particular detector 21. The corrected signal charge packet is stored on capacitor 150 that is also part of the correlated double sampler. It is clocked into the storage capacitor 89 and depending upon the application of the sensor may be clocked to the accumulation capacitor 92 through the MOSFET switch 90. Many frames can be accumulated on capacitor 92 and may or may not be present. The corrected signal is clocked into the analog image processor 12 through MOSFET switch 91. The capacitor selector switches 93 and 95 are controlled by memory cells not shown in FIG. 9. These memory cells can either be dynamic or static, and may be updated once at the beginning of sensor operation or each frame, depending on the application.

Figure 10:
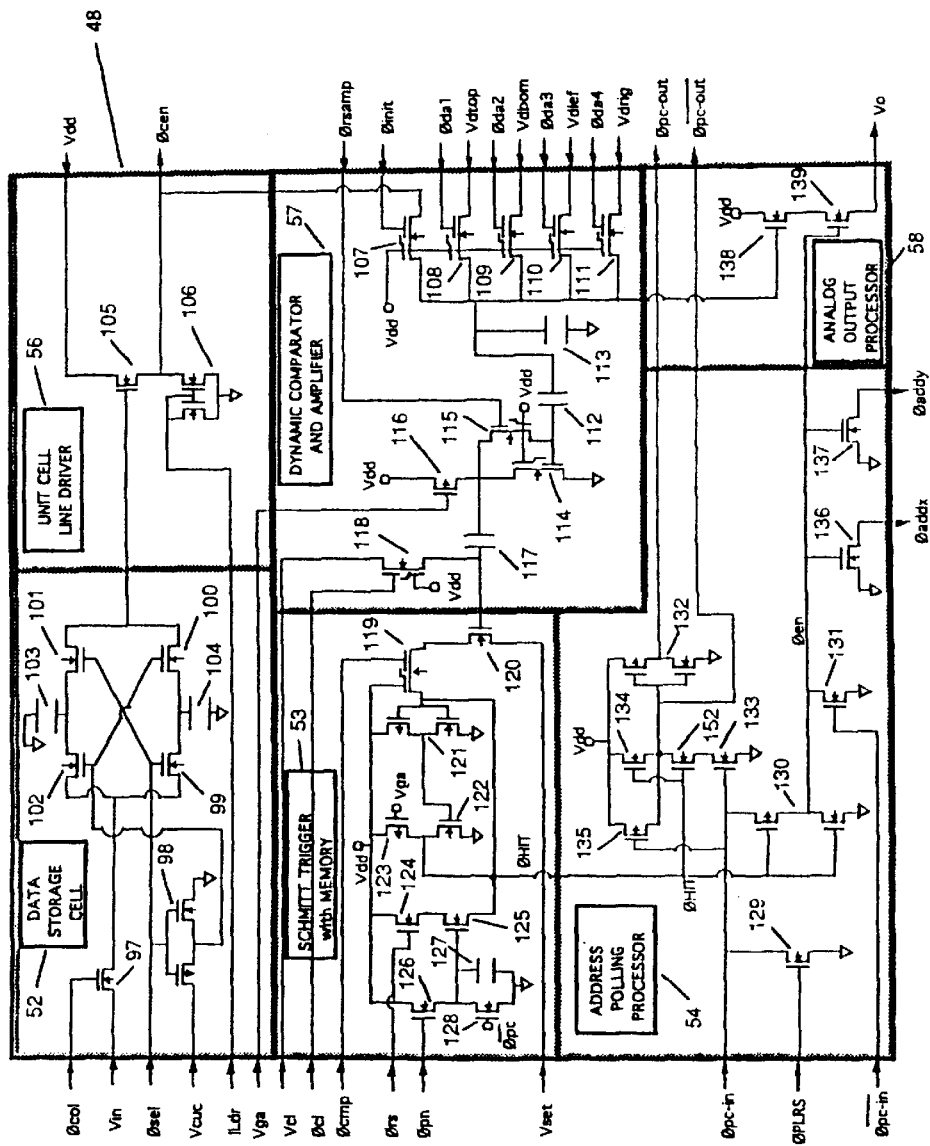
FIG. 10 is schematic of the analog image processor, unit-cell circuitry for an edge detection algorithm.

FIG. 10 shows in greater detail the circuitry of the data processor unit cell 48, shown in the FIG. 7 block diagram. The particular analog algorithm circuitry 57, a dynamic comparator and amplifier, is preferred for edge output in imaging applications. Data is input from the corresponding correction processor unit cell 34 through the MOSFET switch 97 into the data storage unit cell 52. The particular data storage unit cell 52 in FIG. 10 is comprised of two storage capacitors 103 and 104 used for storing alternate frames. In some applications, only one storage capacitor is necessary. One storage capacitor is selected to accept data input to the data storage unit cell 52, while the other capacitor inputs data to the line driver 56. The data storage unit cell is further comprised of an inverter 98, and the MOSFET switches 99, 100, 101 and 102, used in selecting the storage capacitors 103 and 104. The unit cell line driver 56 is comprised of a source follower MOSFET 105, whose gate is connected to the data storage unit cell 52. The output of this transistor 105 is connected to the current mirror load 106 and also to all the surrounding unit cells and the dynamic comparator 57, through the input to the MOSFET switch 107. Besides MOSFET switch 107, the dynamic comparator is comprised of MOSFET switches, 108, 109, 110 and 111 which connect the dynamic comparator 57 to other voltage sources or signals used in the comparison. The five voltage sources, connected into the dynamic comparator by MOSFET switches 108, 109, 110, 111 and 107, are connected to and are converted to charge on the dynamic comparator capacitor 113. This capacitor 113 is AC connected, via capacitor 112, to the gate of a dual gate drive transistor 114. The output of drive transistor 114 is connected to the load transistor 116 and its own input via MOSFET switch 115. The output of the amplifier formed by MOSFET transistors 114 and 116 is also capacitively coupled to the input of the Schmitt trigger with memory through capacitor 117 and this input can be clamped to voltage, Vcl, by means of MOSFET switch 118.

The input to the Schmitt Trigger with Memory 53 is the gate of MOSFET transistor 120. MOSFETS 120 and 123 make up the Schmitt Trigger amplifier with dual gate MOSFET 119 the switch. The memory is comprised of two inverters, the output of the first inverter 121 is connected to the input of the second inverter, comprised of the two transistors 122 and 123, while the output of the second inverter is connected directly to the address polling processor 54. The Schmitt Trigger with Memory is also comprised of circuitry required to reset the logic of the memory. This memory reset circuitry is comprised of MOSFETS 124, 125, 126, 128, and capacitor 127.

The input to the Address Polling Processor 54 is connected to an inverter, 130, and MOSFETS 134 and 152. Inverter 130 is connected to the gates of the MOSFETS 136 and 137 that control the pixel address output lines and also to the gate of the MOSFET switch 139 in the analog output processor 58 which controls the signal output line. The MOSFET switch 131 also controls the pixel address output line. The MOSFETs 134 and 152 are connected to circuitry that controls the polling pulse to the next unit cell. This circuitry is comprised of the inverter 132, the MOSFET switches 135, 133 and 129. The input of the source follower 138 is connected to the output line via the MOSFET switch 139.

In operation, photons or particles either interact directly with the individual detectors 21 of the detector array chip 6 to generate electrical signals, electrons and or holes, that are transferred through bump bonds 8 to corresponding unit cells 17, in the readout array chip Z. In the preferred embodiment of the invention, one unit cell 17 in the readout array corresponds with only one detector 21 in the detector array 6 and is directly underneath it. The readout unit cell 17 contains circuitry that integrates the signal over a specific time frame, which conditions the signal and which then transfers the signal to the correction processor 9. In an alternate design the signal is transferred directly to the Image Processor 12. The pulses that control the time frame and operate the switches in the readout array chip 7 are generated by the drive electronics 3. In the alternate CCD or monolithic detector-array, readout-array design, there is a direct electrical connection between the detector and the readout circuitry within the readout chip. In an alternate design the photons or particles first pass through a lens 13 which focuses the photons or particles on the detector array 6. In still another alternate design the photons or particles first interact with a converter 141 that converts the photons or particles to other more easily detected photons or particles—usually lower energy—before interacting with the detector array 6 of the sensor 2. An example of a converter is a scintillator for conversion of high energy x-rays to visible photons. Another example of a converter is a metal plate for converting very high energy x-rays to electrons. Where visible or IR photons are produced by the converter 14, a lens 13 may be used to focus the light on the detector array 6.

Another example of a converter is a photocathode that converts a photon to an electron. This converter would require a vacuum between the converter and the detector array 6. The HDSS detector array and readout array could then be replaced by an image tube. The image tube may contain high voltage between the photocathode and its internal detector array and readout array for amplification by impact ionization in the internal detector array 6. The detector array 6 could also be replaced by an anode array for electron collection. With and anode array the image tube could contain a microchannel plate for amplification.

Under the circumstances that the detector array 6 is irradiated with a high flux of penetrating photons or particles the metal bump bond pads on either or both of the readout array Z and detector array may be a thick dense material to provide radiation shielding for the readout unit cell 17 electronics. Other circuitry can be shielded directly by means of layers of high density metals such as gold and lead.

For imaging applications the analog electrical signals generated by the photons or particles are transferred from the readout array chip Z to the correction processor 9. Here the analog signals are corrected for the nonuniformities of the individual detectors in the detector array 6, of the individual unit cells 17 in the readout array 7, and the sequence of analog operations from the detector to the image processor 12. Testing the sensor 2 develops the specific corrections. Once the sensor-related corrections are made the signals are transferred to the image processor 12, where the specific analog data processing algorithm is implemented. For example, edge detection, an object isolation and image compression procedure, can be performed simultaneously for all pixels in the image processor 12 by comparing the signals for contiguous pixels. Comparator circuitry 57 implements the algorithm. Schmitt trigger and memory 53 and address polling processor circuitry 54 allow the sensor to output only the signals which satisfy the algorithm—positions and signals of the edges in the image for example—dramatically reducing data output from the sensor 2. Other possible algorithms include motion detection and high-speed object isolation, for example.

There are some circumstances where the correction processor 9 may not be necessary and data can be transferred from the readout array Z (or CCD) directly to the image processor 12. Normally imaging operations require the correction processor 9 to prevent spurious edges and to increase the dynamic range of the image contrast. When the sensor 2 is used in the particle counting and energy discrimination application the correction processor 9 is unnecessary. Data is transferred directly to the image processor unit-cell array 12 as appears in FIG. 8. Here the signal is compared to one or more pairs of energy bounds Vtop and Vbot. To determine the energy bounds of the particle or photon that interacted with the detector of the detector array chip 6 or CCD. These bounds may be input from off-chip electronics and include corrections for the particular gain and offset experienced by the signal in its transfer from its individual detector to the corresponding imager processor unit cell 48. In the counting and energy discrimination application, once the comparison operation in the dynamic comparator and amplifier 57 determines that the signal falls within an energy bin, the address polling processor 54 for that energy bin is activated via the Schmitt Triggers and memories. A polling pulse which rapidly propagates through the polling processors stops at only those unit cells whose address polling processor 54 has been activated. A counter for that particular energy bin is increased by one and the polling continues throughout the whole analog-image-processor, unit-cell array 12. The counter 61 can be on the imager processor chip or off chip. The energy bin counters are read out after the counting operation is completed. For many high-speed counting operations most of the photons or particles are background with energies outside the energy range of interest and do not require counting. The address polling processor 54 design does not waste time counting the background photons and particles and so a high count rate can be achieved. For lower count rate operations the address polling processor 54 could be excluded from analog image processor unit cell 48, the entire analog image processor 12 could be read out after a time frame and the photons or particles in the energy bins counted off-chip.

In operation data is processed in a pipeline mode. Data is transferred between the readout chip 6 and the analog correction processor 9, and between the analog correction processor and the analog image processor 12 in less than a timeframe. Correction operations in the analog correction processor 9 and data processing operations, as well as output, in the analog image processor 12 are also performed in less than a timeframe. Where an inter-processor transfer and processing operation together take longer than a timeframe, information is first stored on chip and then processed. Where data processing and output on the analog image processor 12 take more than a timeframe, multiple outputs are utilized.

The readout circuit in FIG. 4, preferred for counting, energy discrimination and integrating low flux signals, uses a capacitive transimpedance amplifier (CTIA) 22 as a detector interface as well as an amplifier for the relatively small charge from the detector. The detector charges the very small integration capacitor yielding a voltage gain. Including stray capacitances this integration capacitor is typically estimated to be 0.015 pf. The CTIA also buffers the detector current, maintaining a constant bias across the detector.

The Double Correlated Sampler (CDS) 23 at the output stage of the CTIA reduces a potentially large unit cell noise source. The CTIA integration capacitor reset generated noise is correlated: any noise generated at the output of CTIA 23 during reset will be the same at the end of the integration period. The voltage output of the CDS is buffered and amplified by the unit cell output amplifier 24 and then transferred to the clamp and sample circuit; reset circuitry for the readout unit cell integration capacitor (inside the CDS block 23) occurs inside the clamp and sample block 19. The clamp and sample circuitry 25 takes the difference between the voltage on the CDS integration capacitor and the reset voltage to arrive at the signal. The multiplexer, through the switch transistor 26, via the pulse ØMUX, allows column by column data transfer between the readout chip Z and the next chip in the sequence. Depending upon the application, more than one column of data or less than one column of data could be transferred.

The readout circuit in FIG. 5, preferred for integrating a continuous photon or particle flux, maintains a constant voltage across the detector, has a linear response, integrates the signal from the detector with minimal noise, and outputs the signal to the correction processor 9. The readout unit cell circuitry consists of a transistor 28, operating near saturation, with a constant gate voltage $V_g$, that maintains a relatively constant detector voltage. An integration capacitor 29 integrates and stores the charge from the detector and a switch, transistor 31, connects the capacitor to the charge amplifier 32. A column pulse Øcol activates the switch 31.

The detector 21 charge, that is stored on the unit-cell capacitor 29, must be converted to a voltage. This is done in the column amplifier 19, rather than with a unit cell amplifier, conserving chip real estate; the preferred embodiment of the column amplifier 19 is a capacitive transimpedance amplifier (CTIA) 32. Reset circuitry for the readout unit cell integration capacitor 29 occurs inside the column amplifier block 19. The clamp and sample circuitry 25 in the column amplifier block 19 takes the difference between the voltage on the integration capacitor 29 and the reset voltage to arrive at the signal. The multiplexer, through the switch transistor 26, via the pulse ØMUX, allows column by column data transfer between the readout chip 7 and the next chip in the sequence. The speed requirements determine whether column by column transfer of data is required. More than one column or less than one column could be transferred each integration cycle.

Nonuniformities result from both detector and electronics pixel to pixel variations and must be corrected if the parallel processing in the image processor 12 is to yield a high-quality image. Without the analog correction processor 9 the image "noise" could be dominated by these nonuniformities. Nonuniformities result from detector quantum efficiency, detector dark current and physical pixel size variations and readout MOSFET threshold nonuniformities. The effective quantum efficiency may vary due to detector doping, gradient and physical pixel size nonuniformities. On the other hand, the readout MOSFET threshold variations are controlled by substrate doping and fixed oxide charge (Qox) nonuniformities.

Data can be transferred from the readout chip 7 column by column and corrected for gain and DC offset by the analog correction processor unit cells 34. This correction can occur a whole frame at a time or one or more columns at a time. Performing the correction a column at a time is slower than performing the correction a frame at a time but is less silicon intensive and gives a better chip fabrication yield. The analog correction processor 9 may contain input storage capacity for more than one-set of correction data if the readout chip 7 to analog correction processor chip 9 transfer time becomes an appreciable part of the correction processing time. For example, with a two data set storage capacity, one data set is loaded in while the other is used by the unit-cell, analog correction processor 34, The unit-cell gain and offset corrector is implemented in six unique functions or circuit blocks as shown in FIG. 6. The gain charge pump 37 converts the readout signal voltage into a discrete charge packet and then feeds this to the charge amplifier 41. The charge amplifiers 41 are made up of a capacitor transimpedance amplifier (CTIA) with selectable feed back capacitors 38. These amplifiers convert the charge from the charge pumps 37 into a voltage whose value is determined by the combination of feed back capacitors chosen. The amplifier is designed to normalize the readout signal gain to one, thereby correcting for a wide range of gain nonuniformities. The exact number of selectable capacitors 38 is approximately equal to the number of bits of correction necessary. The CTIA approach is preferred because capacitors can be fabricated very uniformly across the array. Capacitor selection for each unit cell is made by means of the correction data loaded into the on-chip analog switch and memory circuits 40 from cash memory.

The gain correction circuitry is the similar the offset correction circuitry except that the corrected offset signal is added to the signal voltage, prior to, during or after gain correction. A predetermined offset voltage in the offset corrector is converted to a charge in the charge pump 37 that is then fed into the charge amplifier 41. The charge amplifier 41 converts this charge packet back into a voltage that is determined by the selected capacitors. The offset voltage is selected to cancel the DC offset produced by its detector and pipeline processing electronics. The output of this amplifier is fed into a combination charge pump and correlated double sampler (CDS) 39 circuit where it is converted back into a charge packet. This charge packet is then fed back into the gain corrector where the output is representative of both a corrected gain and DC offset signal. As for the offset correction, output of the charge amplifier is fed into its CDS where amplifier noise is correlated out. The output of the CDS circuit could be fed into an optional accumulator 42 where the signal-to-noise ratio is enhanced by summing frames. The transfer switch 44, with pulse ØTR, functions to transfer the corrected signal to the analog correction processor column amplifiers 35. These may be similar in design to the readout chip column amplifiers 19.

FIG. 7 shows the analog image processor 12 preferred for image processing. For higher speed applications, data is input one or more columns at a time using the column shift register 46. Data signals, Vin, from a particular detector 21, enter the particular data storage cell 52 in the processing chain, after being corrected by the particular analog correction processor unit cell 34 in the processing chain. Here the signal is either stored for a time frame, as the data from the previous time frame is processed, or it is immediately processed. Selection of the particular data to be processed is made through the select pulse Øsel. The first step in the processing is to drive the signal, by the unit cell line driver 56 to surrounding unit cells and also to the analog algorithm circuitry 57. Line drivers 56 from other unit cells drive signal into the particular unit cell under consideration. These signals are represented as Vdtop, Vdbom, Vdrig and Vdlef in FIG. 7. The unit cell line driver 56 is designed to prevent loss of signal voltage due to the capacitance of the connections. The analog algorithm circuitry 57 implements algorithm. For example the difference between the unit cell signal and that of the surrounding cells can be taken, much like a spatial derivative. Alternatively the difference between the unit cell signal and that of the same unit cell at a previous time (stored on a capacitor for example) can be taken, much like a time derivative. Combining the two procedures the spatial derivative of a time derivative could be taken. Still another possibility is to take the difference between the unit cell signal and some externally input signals. Many important data processing algorithms can be applied to some or all of an array of analog data in this way. If the algorithm is satisfied, for example the signal on the unit cell is less than one or more of the surrounding unit cell signals, the signal is amplified and switches a logic state in the Schmitt Trigger with memory 53. Switching this logic state flags the address polling processor 54 to switch on the unit cell output lines when a polling pulse is sensed. After the algorithm has been implemented, a polling pulse, Øpc, rapidly propagates sequentially through all the analog image processor unit cells 48, in the analog image processor 12, whose address polling processors have not been flagged, stopping at those that have. The x position address line Øaddr-x, the unit cell y position address line Øaddr-x, and the Vout line from the analog output processor 58 are activated by Øpc. Depending upon the application, just the address lines or the analog output processor 58 could be activated. Additionally, by clocking the analog algorithm circuitry 57 many outputs are possible; any of the signals used in the algorithm processing or the signals resulting from the processing could be available for output on Vout. If an address is output, the Øaddr-x signal goes to the column encoder circuitry 51 where it is converted to column address that is readable by the output electronics 4. The Øaddr-y signal goes to the row encoder circuitry 51 where it is converted to a row address that is readable by the output electronics 4.

After the output electronics 4 receives the signals, Vsig, from the analog output processor, external pulses Ørs and Øpn reset the Schmitt trigger with memory logic 53 and the polling pulse Øpc propagates through the address polling processor to the next unit cell in the analog image processor 12.

FIG. 8 an illustration of the analog image process 12 and analog image processor unit cell 48 preferred for energy discrimination and particle counting. Operation is very similar to the operation described for FIG. 7 except the detector signals are not corrected and they are compared to a pair of voltages, upper and lower bounds Vtop and Vbot which are input externally and stored in unit cell memory 60. Vtop and Vbot are unique to the processing chain from a particular detector 21 to its analog image processor unit cell 48 and contain corrections for the processing chain nonuniformities. Under these circumstances the logic in the Schmitt Triggers with memory is not changed unless the signal is smaller than Vtop and larger than Vbot. When the polling pulse activates the analog output processor 58 a pulse is sent to a counter and poll-next timing generator 61. The pulse is counted and the appropriate pulses are returned to the unit cell to reset the Schmitt triggers and memories 59 logic. After process and polling is completed, the counter and poll-next timing generator 61 outputs the count to the output electronics 4 and the counter is reset by the drive electronics 3. The counter could also be located off-chip and the counting done by the output electronics 4.

More than one energy discrimination interval can be handled by a single analog image processor by comparing the signal with more than one pair of bounds and including a counter associated with each interval. Alternatively one analog image processor 12 could be associated with each energy interval.

One of the features of the current invention that allows very rapid output is the address polling processor 54 in each unit cell of the analog image processor 12: the external electronics is only activated to read out a unit cell if there is useful data available. Under some circumstances the address polling processor could be removed and the output electronics 4 adapted to recognize a flagged or unflagged unit cell, reading out only those unit cells that are flagged. Here all unit cells would be accessed by the output electronics 4 but time would be spent on reading out only a few unit cells.

There are some circumstances where it is appropriate to have the output electronics 4 read out the signals in all unit cells making the flagging circuitry unnecessary.

FIG. 9 shows the circuitry details of the preferred analog correction processor unit cell 34. The gain and offset memory cells 40 function to activate the proper selectable CTIA feedback capacitors. The operation of this processor begins by reading in the voltage signals from the output of the readout (Vin) and at the same time the DC offset voltage is also read in. Both the gain and offset charge pumps and amplifiers (CTIAs) are working in parallel at this point. The (Vin) and (Voff) voltages are read in by clocking transistors 64 and 67 and held on capacitors 65 and 68 respectfully. At this time the conversion from voltage to charge packet is complete and next step is to clock this charge into the charge amplifier. The charge amplifier is a capacitive transimpedance amplifier (CTIA) that integrates and amplifies this charge to the degree determined by the selected feedback capacitors 76 and 94. The output of the offset CTIA is correlated double sampled (CDS) and charged pumped back into the gain corrector. In this way, the readout signal (Vin) is corrected for both gain and DC offset. The output of the gain corrector is correlated double sampled by transistor 75 and capacitors 87 and 150 and the output is fed into the signal accumulator for additional signal-to-noise enhancements. The ratio between capacitors 89 and 92 in the signal accumulator determine the total number of accumulations possible. The store (ØST) pulse converts the CDS voltage into a small charge and the accumulator (ØAC) pulse accumulates this charge. The transfer gate 91 feeds this charge into the column amplifier when a (ØTR) pulse is activated. The column amplifier is the same design as the readout column amplifier.

FIG. 10 shows the circuitry details of the preferred analog, image-processor unit cell 48. The analog algorithm circuitry 57 preferred for outputting the signals and/or position of the edges in an image, called dynamic comparator and amplifier circuitry is represented. The data storage cell 52 in this design allows alternate storage capacitors 103 and 104 to receive the signal Vin to be processed. One capacitor receives the signal while the signal on the other capacitor is being processed. Pulse Øsel determines the storage capacitor selection. Pulse Øcol clocks the new signal into one of the storage capacitors. The unit cell line driver 56 buffers the storage capacitor and the source follower 105 drives the stored signal, now Vcen, to both the surrounding unit cells and the dynamic comparator and amplifier 57 of its own unit cell.

The specific function of the dynamic comparator and amplifier 57 is to compare signals against the reference signal Vcen one at a time. For the image processing algorithm depicted in FIG. 10, the signals from the four surrounding pixels or unit cells are compared against the center reference pixel or unit cell and an output is generated if the surrounding pixel voltage signals are less than the center reference pixel voltage Vcen. (More or less than four comparisons could be made if the algorithm demanded it.) The comparator determines if any of the four voltages (Vdtop, Vdbom, Vdrig, Vdlef) are less than the reference voltage (Vcen). The dynamic comparator and amplifier 57 is designed with a built-in amplifier to avoid the unity gain sensitivity restrictions. The output voltage swing is inverted and the output of the comparator operation is amplified by a factor of about one hundred. The amplifier is AC coupled to the front end of the dynamic comparator so that the amplifier can be both self-biasing and independent of the comparison operation. The voltage amplifier employs a novel self-biasing circuit that eliminates MOSFET threshold variations that would otherwise be induced in biasing this voltage amplifier across the unit cells. This amplified signal is what the Schmitt trigger 53 and address polling processor 54 require in order to produce maximum sensitivity.

The dynamic comparator is made up multiplexing transistors 107, 108, 109, 110 and 111, holding capacitor 113 and a reference clamping transistor 118. The voltage amplifier is made up of the driver transistor 114, the load transistor 116 and the bias reset transistor 115 and is AC coupled to the comparator by coupling capacitors 117 and 112. This one stage amplifier inverts the polarity of the incoming signal from the holding capacitor 113 and outputs an amplified signal. The comparator is pumped with data (Vcen, Vdtop, Vdbom, Vdrig, Vdlef) through the use of the five transistor multiplexer and their associated clocks (Øinit, Ørsamp, Øda1, Øda2, Øda3, Øda4). The first step in each comparison is the establishment the reference voltage Vcen. The reference voltage is established by clocking the Øint, Ørsamp and Øcl pulse thereby turning on both the multiplexer transistor 107, and the clamp transistor 118 and resetting the amplifier all at the same time. This action enables the center reference voltage (Vcen) to be fed onto the holding capacitor 113. The amplifier is reset by the (Ørsamp) pulse while reset transistor 115 is on hard establishing the reference voltage for the compare operation. The input voltage (Vcen) which is representative of the signal on the center pixel is now made equivalent to the compare reference voltage (Vcl). In the next operational sequence, the gating pulse (Øda1) feeds one of the four surrounding pixel signals (Vdtop) to the holding capacitor 113. If the new voltage on holding capacitor 113 is less than the previous voltage, then the amplifier will amplify this signal. If however, the voltage on this gate is equal to or greater than the previous gate voltage, then no amplification takes place because the amplifier is already in the reset ground state. The next three sequential compares are identical to the first one and are initiated by pulsing (Øinit, Øcl, Øda2), (Øinit, Øcl, Øda3) and (Øinit, Øcl, Øda4) respectively. The operational pulses (Øint and Ørsamp) reset the comparator by resetting the voltage amplifier and re-biasing it for the next compare operation.

The output of the dynamic comparator and amplifier 57 is fed directly into the Schmitt trigger and memory 53 in order to hold the results of the compare operations. The address polling processor 54 is activated into service, with this algorithm, if the result of at least one of the four comparisons changed the memory cell from a high to a low.

The function of the Schmitt trigger and memory 53 is to examine each compare operation and record into its memory the result. The Schmitt trigger and memory 53 is made up of three basic circuits, the Schmitt trigger, the memory cell and the reset circuit. When the input voltage to the Schmitt exceeds a predetermined threshold value the output voltage changes logic state. The output of the Schmitt trigger is connected to a static memory cell and is used to hold its logic state until it is reset. The reset logic is also connected to the memory cell and functions to reset the memory cell to the "one" or high state in preparation for the next four compare cycles. The output of the Schmitt memory cell is connected to the address polling processor 54 in order to flag the unit cell into activation. The address polling processor is activated if any one of the four compare operation signals causes the memory cell to go from a high to a low.

The Schmitt trigger is made up the drive transistor 120, the logical switch 123, and the load transistor 123. The threshold of the Schmitt trigger is set grossly by the Vset line. The output of this amplifier drives the memory cell which is composed of the inverter 121 and the second inverter made from transistors 122 and 123. The output of the first inverter is connected to the input of the second forming a latched logical state.

The reset circuitry is constructed of the four transistors 124, 125, 126, and 128 and has a double clock reset function to ensure data integrity when resetting the activated unit cell. A unit cell 48 is selected for activation by the interaction of the polling pulse and the unit cell's address polling processor 54 logic. The reset is achieved after the data is transferred to the external processor and the two reset pulses Øpn and Ørs are sequentially received from the drive electronics 3. When the unit cell is polled by the previous unit cell, the pulse Øpc-bar, generated by the previous cell's address polling processor (APP), is low and turns off transistor 128. When the poll next pulse Øpn is activated, signifying the completion of the unit cell service cycle, transistor 126 is turned on resulting in the charging of the memory capacitor 127 and thereby turning on transistor 125. The next sequential pulse Ørs turns on transistor 124 and resets the Schmitt trigger memory cell to the one or high state. Only the unit cell 48 at which the poll has stopped is affected by this action. The neighboring unit cells are unaffected.

The operation of the Schmitt trigger with memory 53 depends on the timing. All Schmitt triggers with memory 53 on the analog image processor 12 are globally reset to the one state at the start of all compare operations. At the completion of a dynamic compare operation the Schmitt trigger with memory 53 is activated into operation by a compare pulse Øcmp. This pulse activates the Schmitt amplifier and flips its memory cell logic state if the input voltage to the comparator exceeds a defined threshold. If this input threshold is not exceeded, during any of the four comparisons then the memory cell is left in the same logical state as before the compare pulse. Once the logic state has been changed it will remain changed until reset.

At the end of the four compare operations for the FIG. 10 dynamic comparator and amplifier, or after any algorithm has been implemented by the analog algorithm circuitry 57, a high—the polling pulse—propagates through all the address polling processors 53 of the analog image processor unit cells 18. All the address polling processors 53, in the unit cells 48, on the analog image processor 12 are sequentially connected. (If there are more than one output, only unit cells 48 in the sections of the chip associated the output will be connected.) The unit cells in any given row are connected and the rows are connected, at the end of the rows. The row connections alternate from the left most unit cells to the right most unit cells so the polling pulse works its way down the chip in a serpentine fashion. If the memory cell in the Schmitt trigger with memory has not changed its logic than the next sequentially chained address polling processor 53 is polled and the process is repeated until all address polling processors 53 are polled. If on the other hand, the Schmitt trigger memory cell has changed state, its address polling processor will be activated and the associated unit cell serviced when the polling pulse arrives. At the completion of the service cycle, pulsing Øpn and Ørs sequentially resets the Schmitt trigger with memory circuitry. This reset allows the polling pulse to propagate to the next address polling processor 53 in the sequence.

When activated by the polling pulse, the address polling processor 53 delivers the address of the analog image-processor unit cell 48 to the external electronics. It also activates the analog output processor 58 that can deliver one or more signals that can be accessed via the analog algorithm circuitry 57. For the specific analog algorithm circuitry in FIG. 10, the signal in the central pixel Vcen as well as the signals of the surrounding four pixels can be output by means of the comparator multiplexer circuitry described above. In traditionally designed image processors each pixel of information must be addressed in order to access its signal. This invention saves time by including a separate address polling processors 53 in each unit cell. Only the unit cells with valid signals are activated, thereby reducing the amount of signal data processed by the external electronics.

The operation of the address polling processors 53 is very similar to a controlled ring oscillator that has no feed back path. Each address polling processors 53 is connected to its neighbor in a straight line or serpentine manner by tying the output of one APP to the input of the next. The sequence of operations, in a full two dimensional array, start by propagating a logical 1 or high from the top left unit cell to its neighbor on the right. This logical high will then propagate through all of the unit cells in the chain until it reaches the bottom left cell. Logical propagation will halt at any unit cell that has been flagged or activated by the Schmitt trigger memory cell. At the time the logic pulse is halted by an activated memory cell, the address polling processors 53 will enable both the analog output amplifier processor 58 and the X and Y address of the unit cell 12. The external electronics will then latch the address polling processor-delivered address and proceed to read the analog output line. After reading the analog output line, the drive electronics will deliver both a poll next and a reset pulse allowing the next sequentially chained address polling processor to be interrogated. This sequence of events will proceed down the linear or serpentine chain until the last address polling processor on the analog image processor 12 has been polled.

The address polling processor (APP) utilizes logic gates constructed from both N-channel and P-channel transistors to define its logic states. A two input NAND gate is configured from the four transistors 133, 134, 135, and 151 and connected to its inverter 132. The inverter 130 and the transistor 131 are functionally equivalent to two inverters and a two input NAND gate. The transistors 136 and 137 are functionally equivalent to two buffer inverters. The address polling processor global reset function (all unit cells at once) is made up of transistor 129 and serves to prepare the address polling processor for a polling sequence. The address polling processors are connected by tying the output propagation line, Øpc-out, of one to the input Øpc-in of the next. In this way a polling chain is created.

The APP is initialized by a low ØPLRS. This starts a logical 1 or high propagating through the first APP in the chain. The high then propagates from the input Øpc-in to the output Øpc-out of each APP for which the Schmitt trigger with memory 53 is still in a high state. When the Schmitt trigger with memory 53 is in a high state the ØHIT line is high and the address lines Øaddr-x and Øaddr-y and the analog output processor are not activated: the transistors 136, 137, and 139 are off. Because transistors 133 and 151 are on and transistor 134 is off, a low appears at the input of inverter 132 and a high appears at the output of the APP, Øpc-out. The polling pulse therefore propagates to the next unit cell in the sequence.

This propagation continues until an activated (flagged) APP is found. Activation or flagging of the APP occurs when the Schmitt trigger memory cell has changed to a logical 0 or low making ØHIT low. The inverter 130 is activated when the polling pulse arrives making Øen go high. This turns on the address lines Øaddr-x and Øaddr-y and the analog output processor by turning on transistors 136, 137, and 139. Since the low ØHIT turns transistor 151 off and transistor 134 on, a high appears across the inverter 132 and a low appears on the APP output line Øpc-out. The polling pulse, a high, does not propagate through the unit cell until the Schmitt trigger memory is reset to a high. The output electronics 4 grabs the unit cell address lines and samples the analog output signal, if an analog signal output is needed. A poll next pulse Øpn and a reset pulse Ørs are then delivered to the Schmitt trigger with memory 53, resetting its logic. These two pulses clear the state of the memory cell signifying the completion of the APP service cycle. This action also allows the polling signal to propagate through the NAND and inverter gates. In this way the next sequential APP is interrogated to determine whether it is activated. The speed at which propagation occurs from APP to APP is determined by the time it takes a high to propagate through the NAND gate and its inverter, usually a fraction of a nanosecond.

Although detailed embodiments of the present invention have been provided for photon and particle imaging, energy discrimination and counting, the present invention is not limited to only those embodiments but also includes uses and adaptations that would be equivalent to those defined in the following claims:

We claim:

1. A device for analysis of photon and particle data, said device comprising
one or a plurality of sensor means for detecting photons or particles, said sensor means comprising
detector array means for conversion of said photons and particles to electron-hole pairs, said detector array means comprising a plurality of detectors,
readout array means electrically connected to said detector array means said readout array means comprising
a plurality of readout unit cells, each unit cell comprising storage means for receiving signals from a corresponding one of said detectors,
said readout unit cell comprising readout circuitry means for continuous integration of the signals received by said storage means over a time frame and for readout after integration,
connection means for transfer of signals on said readout unit cells to one or more analog image processor means,
analog image processor means comprising,
a plurality of image processor unit cells comprising,
circuitry means for implementing image processing, energy discrimination or other algorithms and circuitry means for outputting signals,
drive electronics adapted to provide the timing pulses and biases necessary to provide the said signals to the output electronics,
output electronics adapted to acquire said signals from said analog image processor means, adapted to convert from analog to digital signals and adapted for storing digital signals until needed by the digital data processor,
digital data processors adapted to analyze said digital signals form the output electronics.

2. A sensor for analysis of photon and particle data, said sensor comprising
one or a plurality of sensor means for detecting photons or particles, said sensor means comprising
detector array means for conversion of said photons and particles to electron-hole pairs, said detector array means comprising a plurality of detectors,
readout array means electrically connected to said detector array means said readout array means comprising
a plurality of readout unit cells, each unit cell comprising storage means for receiving signals from a corresponding one of said detectors,
said readout unit cell comprising readout circuitry means for continuous integration of the signals received by said storage means over a time frame and for readout after integration,
connection means for transfer of signals on said readout unit cells to one or more analog image processor means,
analog image processor means comprising,
   a plurality of image processor unit cells comprising,
      circuitry means for implementing image processing, energy discrimination or other algorithms and circuitry means for outputting signals.

3. The device as in one of claims 1 and 2, wherein the said analog image processor means is electrically connected to the said readout array means by metal bumps.

4. The device as in one of claims 1 and 2, wherein the said detector array means, said readout array means, and said analog image processor means are chip means and are stacked into a cube with the bond pads of the chip means electrically connected.

* * * * *